(12) United States Patent
Higashiho

(10) Patent No.: US 6,542,417 B2
(45) Date of Patent: Apr. 1, 2003

(54) SEMICONDUCTOR MEMORY AND METHOD FOR CONTROLLING THE SAME

(75) Inventor: Mitsuhiro Higashiho, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 7 days.

(21) Appl. No.: 09/760,709

(22) Filed: Jan. 17, 2001

(65) Prior Publication Data

US 2001/0008492 A1 Jul. 19, 2001

(30) Foreign Application Priority Data

Jan. 18, 2000 (JP) ........................................ 2000-009249

(51) Int. Cl.⁷ .................................................. G11C 7/00
(52) U.S. Cl. .................. 365/196; 365/189.01; 365/205; 365/207
(58) Field of Search ............................. 365/196, 189.01, 365/205, 207, 208

(56) References Cited

U.S. PATENT DOCUMENTS 5,555,210 A * 9/1996 Kato .......................... 365/196
5,796,668 A   8/1998 Seo et al. .................... 365/207
6,031,785 A * 2/2000 Park et al. ............. 365/230.08
6,222,787 B1 * 4/2001 Yoon et al. .................. 365/226
6,301,191 B1 * 10/2001 Ooishi ........................ 365/233

FOREIGN PATENT DOCUMENTS

JP 2-226581 9/1990
JP 7-244986 9/1995

* cited by examiner

*Primary Examiner*—Son T. Dinh
(74) *Attorney, Agent, or Firm*—Arent Fox Kintner Plotkin & Kahn, PLLC

(57) ABSTRACT

A semiconductor memory operates in a write mode and a read mode. The memory includes memory cells, pairs of bit lines connected to the memory cells, sense amplifiers having first and second I/O terminals connected to the bit lines, column selection gates connected to the associated sense amplifiers, and a control circuit. The control circuit controls the sense amplifiers and the column selection gate, so that selected column selection gate turns on before the sense amplifiers are activated during the write mode. The write data is applied to the first I/O terminals of the sense amplifiers. The semiconductor memory thus produced according to the present invention has a reduced circuit size.

14 Claims, 12 Drawing Sheets

SEMICONDUCTOR MEMORY AND METHOD FOR CONTROLLING THE SAME

BACKGROUND OF THE INVENTION

The present invention relates to a semiconductor memory. More particularly, it relates to a data bus configuration of a semiconductor memory, such as a DRAM, and data read/write operations of a semiconductor memory.

The increase in memory capacity of recent semiconductor memories has resulted in an increase in the chip area of the semiconductor memories.

Such a semiconductor memory has a plurality of banks. Write data is provided to each bank through a global data bus (GDB). Further, read data is output from each bank through the global data bus. Each bank has a local data bus (LDB).

FIG. 1 is a schematic circuit diagram of a first prior art example of a semiconductor memory 100 and illustrates the connection between a local data bus and memory cells.

The semiconductor memory 100 has a cell array 1, which includes a plurality of word lines (two shown in the drawing) WL1, WL2 and a plurality of bit line pairs (one pair shown in the drawing) BL, /BL. A memory cell 2 is connected to a node between the word line WL1 and the bit pairs BL, /BL. Another memory cell 2 is connected to a node between the word line WL2 and the bit pairs BL, /BL. The bit line /BL is driven by a logic signal that is in inverse relationship with a signal that drives the bit line BL. In other words, the bit line pair BL, /BL is driven by complimentary signals.

The potentials of the word lines WL1, WL2 are controlled by a row decoder (not shown) in correspondence with read or write operations. The row decoder functions in response to an external command.

The bit line pair BL, /BL is connected to I/O terminals T1, T2 of a sense amplifier 5 via transfer gates 3, 4, respectively. The I/O terminals T1, T2 are connected to data bus lines DB, /DB of a local data bus via column gates 6, 7, respectively.

With reference to FIG. 2, during a read mode, a signal of the word line WL1 goes high in response to a read command received from an external device. This transfers the data stored in the memory cells 2 to the bit line BL. In response to a control signal BT, the data of the bit line BL is transferred to the sense amplifier 5 via the transfer gate 3. Then, the sense amplifier 5, which is activated by a read command, drives the bit line pairs BL, /BL in accordance with the transferred data to a predetermined potential in a complementary manner. The column gates 6, 7 are activated when a column selection signal CL goes high. This causes the potential at the data bus line pair DB, /DB to be the same as the potential at the bit line pair BL, /BL. In this manner, the data of the memory cells 2 is transferred to the data bus line pair DB, /DB.

With reference to FIG. 3, during a write mode, the signal of the word line WL1 goes high in response to a write command received from the external device. As a result, data is read from the memory cells 2. Subsequent to the activation of the sense amplifier 5, an activation of the column gates 6, 7 in response to the column selection signal CL transfers the data from the data bus line pair DB, /DB to the sense amplifier 5 via the columns gates 6, 7. The sense amplifier 5 drives the bit line pair BL, /BL in accordance with the data. This writes the data transferred from the data bus line pair DB, /DB to the memory cells 2.

In the above prior art example, one bit of data is transferred by the two complementary data bus lines DB, /DB. This increases the circuit area and cost of the semiconductor memory.

To solve this problem, a second prior art example of a semiconductor memory 200 having a single-phase data bus configuration has been proposed. The semiconductor memory 200 includes a single-phase local data bus DB. The data bus DB is directly connected to a bit line BL. An inverting latch 8 is connected between the bit line BL and a bit line /BL. The inverting latch 8 inverts the data transferred through the data bus line DB and provides the inverted data to the bit line /BL. The two bit lines BL, /BL are driven in a complementary manner.

In the second prior art example, the number of data bus lines forming a local data bus is less than that of the first prior art example. Thus, the wiring area is smaller that the first prior art example. However, the second prior art example requires an inverting latch 8 for each bit line pair BL, /BL. This increases the circuit area.

The inverting latch 8 may be eliminated. In such a case, however, even when high potential data is applied to the data bus DB during the write operation, the high potential data would not be transferred to the sense amplifier 5 due to the drive capability of the sense amplifier 5 and the column gate 6.

SUMMARY OF THE INVENTION

It is an object of the present invention to provide a semiconductor memory having a reduced circuit area.

To achieve the above object, the present invention provides a semiconductor memory including a plurality of memory cells and having a write mode. The semiconductor memory includes a plurality of pairs of bit lines connected to the memory cells and a plurality of sense amplifiers, each having a first I/O terminal and a second I/O terminal which are connected to an associated pair of the bit lines. The semiconductor memory further includes a plurality of column selection gates, each connected to the first I/O terminal of an associated one of the sense amplifiers, a data bus connected to the column selection gates, and a control circuit connected to the sense amplifiers. The control circuit controls the sense amplifiers and the column selection gate, so that selected column selection gate turns on before the sense amplifiers are activated during the write mode.

The present invention further includes a method for controlling a semiconductor memory including a plurality of memory cells, a plurality of pairs of bit lines connected to the memory cells, a plurality of sense amplifiers, each having a first I/O terminal and a second I/O terminal which are connected to an associated pair of the bit lines, a plurality of column selection gates, each connected to the first I/O terminal of an associated one of the sense amplifiers, and a data bus connected to the column selection gates. The semiconductor memory is operated in a write mode and a read mode. Data is written to the memory cells in the write mode, and data is read from the memory cells in the read mode. The method includes selectively operating the column selection circuit to apply a potential of the data bus to the first I/O terminal of a selected one of the sense amplifiers during the write mode, and activating the selected one of the sense amplifiers during the write mode.

The present invention further includes a method for writing a semiconductor memory. The method includes selectively operating column selection circuits to apply a potential of a data bus to a first I/O terminal of a selected one of sense amplifiers, then activating the selected one of the sense amplifiers.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the description of the following exemplary embodiments together with the accompanying drawings in which.

DETAILED DESCRIPTION OF THE PREFERRED EMBODIMENTS

In the following drawings, identical numerals are used for labeling the same elements.

[First Embodiment]

Figure 7:
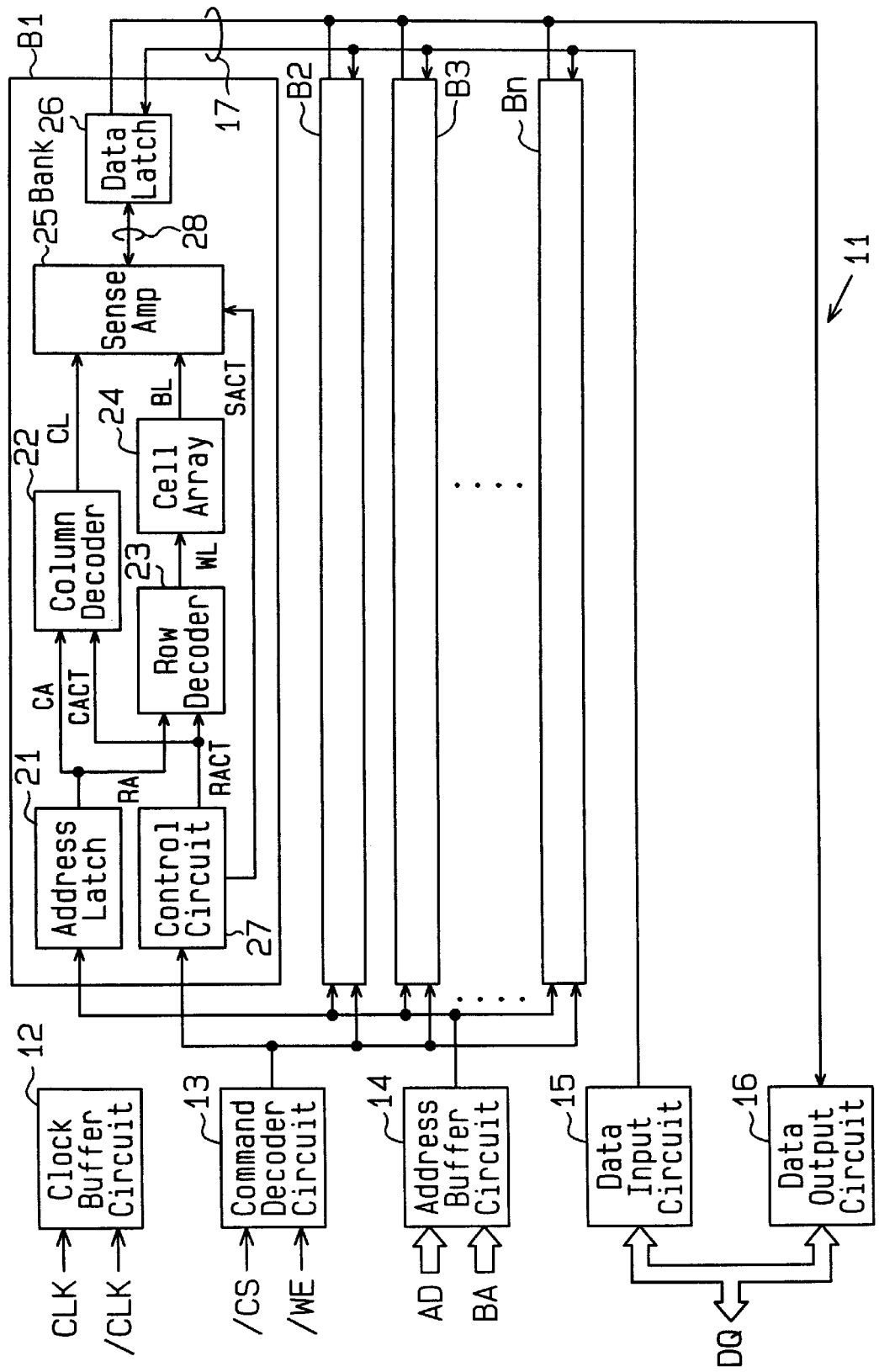
FIG. 7 is a schematic block circuit diagram of a semiconductor memory according to a first embodiment of the present invention.

FIG. 7 is a schematic block diagram of a semiconductor memory 11 according to a first embodiment of the present invention. The semiconductor memory 11 is applied to a fast cycle RAM (FCRAM).

The semiconductor memory 11 includes a clock buffer circuit 12, a command decoder circuit 13, an address buffer circuit 14, a data input circuit 15, a data output circuit 16, and a plurality of banks B1, B2, B3, . . . , Bn.

The clock buffer circuit 12 receives complementary external clock signals CLK, /CLK from an external device and generates an internal clock signal. The internal clock signal is provided to the command decoder circuit 13, the address buffer circuit 14, the data input circuit 15, the data output circuit 16, and each of the banks B1–Bn.

The command decoder circuit 13 receives an external command from an external device (not shown) in accordance with the internal clock signal from the clock buffer circuit 12. In the first embodiment, the external command is assigned in accordance with the combination of the levels (high or low) of a chip select signal /CS, a write enable signal /WE, a column address strobe signal, and a row address strobe signal. The command decoder circuit 13 decodes the external command, generates various internal commands such as a write command, a read command, and a refresh command, and provides the internal command to the banks B1–Bn.

The address buffer circuit 14 receives an address signal AD and a bank address signal BA from the external device in accordance with the internal command. The address buffer circuit 14 buffers the address signal AD, provides the address signal AD to the banks B1–Bn, and activates one of the banks B1–Bn (e.g., B1) in accordance with the bank address signal BA. The activated bank B1 performs a read operation, or a write operation, in accordance with the internal code from the command decoder circuit 13.

The data input circuit 15 and the data output circuit 16 are connected to each of the banks B1–Bn by a global data bus (GDB) 17. The data input circuit 15 receives write data DQ from the external device, buffers the write data DQ, and provides the write data DQ to the banks B1–Bn through the global data bus 17. The data output circuit 16 receives read data from the activated one of the banks B1–Bn through the global data bus 17, buffers the read data DQ, and provides the read data DQ to the external device.

The configuration of the banks B1–Bn will now be discussed. The banks B1–Bn have identical configurations. Thus, the following description centers on only the bank B1 by the way of example, which also applies to the remaining banks B2–Bn.

The bank B1 includes an address latch 21, a column decoder 22, a row decoder 23, a cell array 24, a sense amplifier 25, a data latch 26, and a control circuit 27.

The address latch 21 latches the address signal AD provided from the address buffer circuit 14 and generates a column address signal CA and a row address signal RA. Further, the address latch 21 provides the column address signal CA to the column decoder 22 and the row address signal RA to the row decoder 23.

The column decoder 22 decodes the column address signal CA and generates a column selection signal CL. Further, the column decoder 22 provides the column selection signal CL to the sense amplifier 25.

The row decoder 23 is connected to the cell array 24 by a plurality of word lines WL. Further, the row decoder 23 decodes the row address signal RA and activates one of the word lines WL.

The cell array 24 includes the word lines WL, a plurality of bit lines BL, and a plurality of memory cells connected to nodes between the word lines WL and the bit lines BL. During the read mode, read data is provided from the memory cell connected to the activated one of the word line WL to the bit lines BL. During the write mode, write data provided from the bit lines BL is stored in the memory cell connected to the activated one of the word lines WL.

The sense amplifier 25 is connected to the cell array 24 by the bit lines BL and to the data latch 26 by a local data bus (LDB) 28. During the read mode, the sense amplifier 25 amplifies the read data transferred from the bit lines BL corresponding to the column selection signal CL and provides the amplified signal of the read data to the data latch 26 through the local data bus 28. During the write mode, the sense amplifier 25 amplifies the write data provided through the local data bus 28 and provides the amplified signal to the bit lines BL.

During the read mode, the data latch 26 latches the read data provided by the sense amplifier 25 and provides the latched data to the data output circuit 16 through the global data bus 17. During the write mode, the data latch 26 latches the write data provided by the data input circuit 15 through the global data bus 17 and provides the latched data to the sense amplifier 25 via the local data bus 28.

Based on the internal command from the command decoder circuit 13, the control circuit 27 generates control signals CACT, RACT, SACT, which respectively control the timing for activating the column decoder 22, the row decoder 23, and the sense amplifier 25.

Figure 8:
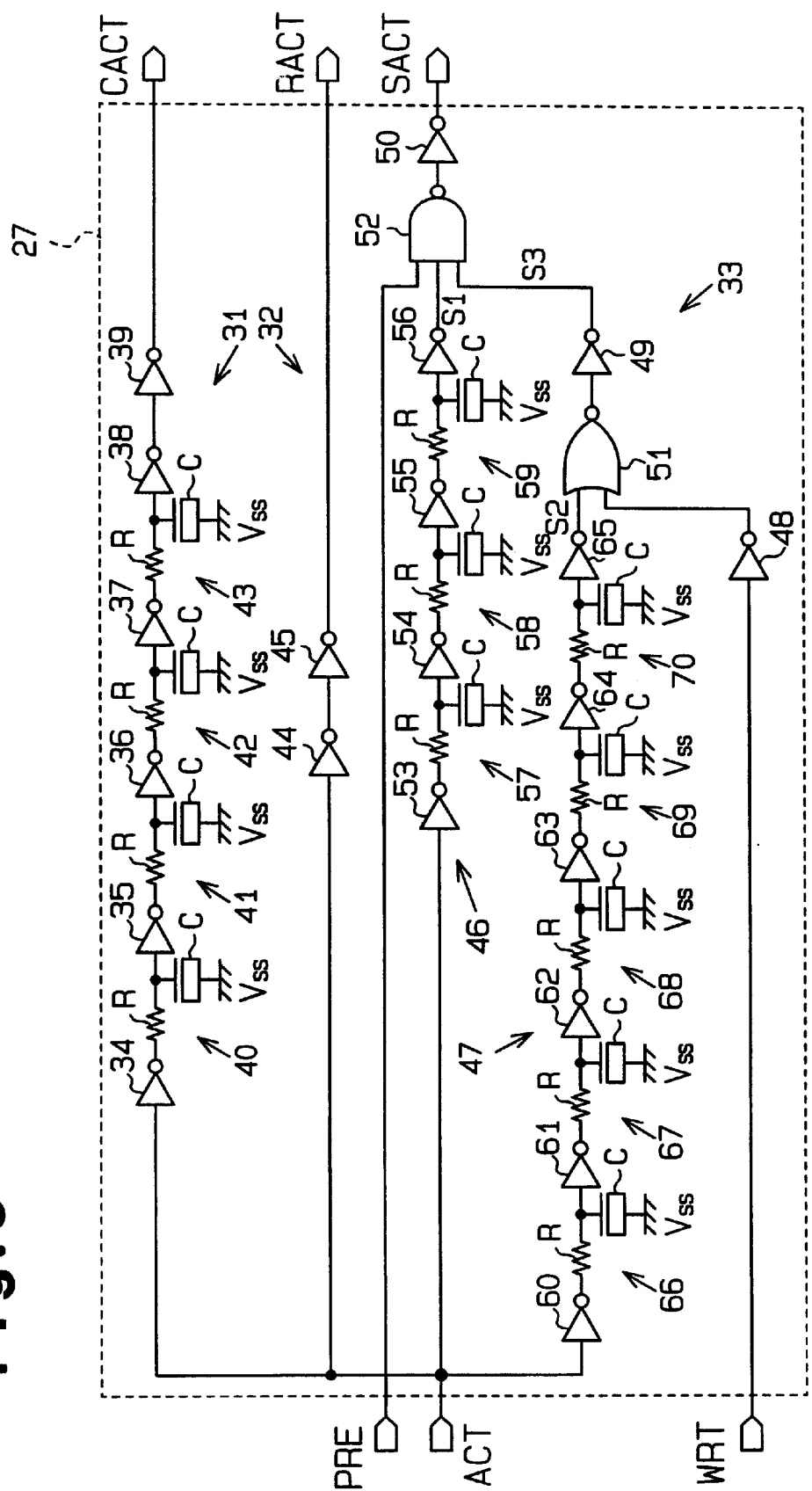
FIG. 8 is a schematic circuit diagram of a control circuit of the semiconductor memory of FIG. 7.

FIG. 8 is a schematic circuit diagram of the control circuit 27. The control circuit 27 receives from the command decoder circuit 13 a precharge signal PRE, an activation signal ACT, and a write signal WRT as the internal commands to generate the control signals CACT, RACT, SACT. Further, the control circuit 27 has signal generation sections 31, 32, 33 for generating the control signals CACT, RACT, SACT, respectively.

The first signal generation circuit 31 is a column control signal generation circuit, which generates and provides to the column decoder 22 (see FIG. 7) the first control signal CACT in accordance with the activation signal ACT. The second signal generation circuit 32 is a row control signal generation circuit, which generates and provides to the row decoder 23 (see FIG. 7) the second control signal RACT in accordance with the activation signal ACT. The third signal generation circuit 33 is a sense amplifier control signal generation circuit, which generates and provides to the sense amplifier 25 (see FIG. 7) the third control signal SACT in accordance with the activation signal ACT and the write signal WRT.

The first signal generation circuit 31, which is a delay circuit, includes an even number (six in the first embodiment) of inverters 34, 35, 36, 37, 38, 39 and a plurality (four in the first embodiment) of integrators 40, 41, 42, 43. Each of the integrators 40–43 includes a resistor R and a capacitor C. The inverters 34–39 are connected in series. Each of the integrators 40–43 is connected between an adjacent pair of the first to fifth inverters 34–38. The first inverter 34 is provided with the activation signal ACT, and the sixth inverter 39 outputs the first control signal CACT. The first signal generation circuit 31 delays the activation signal ACT by a first time delay t1, which is determined by the inverters 34–39 and the integrators 40–43, to generate a delayed activation signal ACT (first control signal CACT).

The second signal generation circuit 32, which is a delay circuit, includes a plurality of (two in the first embodiment) series-connected inverters 44, 45. The first inverter 44 is provided with the activation signal ACT, and the second inverter 45 outputs the second control signal RACT. The second signal generation circuit 32 delays the activation signal ACT by a second time delay t2, which is determined by the inverters 44, 45, to generate a delayed activation signal ACT (second control signal RACT).

The third signal generation circuit 33 includes a first delay circuit 46, a second delay circuit 47, inverters 48, 49, 50, a NOR circuit 51, and a NAND circuit 52.

The first delay circuit 46 includes an even number (four in the first embodiment) of inverters 53, 54, 55, 56 and a plurality (three in the first embodiment) of integrators 57, 58, 59. Each of the integrators 57–59 includes a resistor R and a capacitor C. The inverters 53–56 are connected in series. Each of the integrators 57–59 is connected between an adjacent pair of the inverters 53–56. The first inverter 53 is provided with the activation signal ACT, and the output terminal of the fourth inverter 56 is connected to a first input terminal of the NAND circuit 52. The first delay circuit 46 delays the activation signal ACT by a third time delay t3, which is determined by the inverters 53–56 and the integrators 57–59, and provides the delayed activation signal ACT, or a first delayed signal S1, to the NAND circuit 52.

The number of integrators in the first delay circuit 46 is less than that of the first signal generation circuit 31, and the second signal generation circuit 32 does not include an integrator. Accordingly, the third time delay t3 is shorter than the first time delay t1 but longer than the second time delay t2. In other words, the second control signal RACT goes high first, the first delayed signal S1 subsequently goes high, and then the first control signal CACT goes high.

The second delay circuit 47 includes an even number (six in the first embodiment) of inverters 60, 61, 62, 63, 64, 65 and a plurality (five in the first embodiment) of integrators 66, 67, 68, 69, 70. Each of the integrators 66–70 includes a resistor R and a capacitor C. The inverters 60–65 are connected in series. Each of the integrators 66–70 is connected between an adjacent pair of the inverters 60–65. The first inverter 60 is provided with the activation signal ACT, and the output terminal of the sixth inverter 65 is connected to a first input terminal of the NOR circuit 51. The second delay circuit 47 delays the activation signal ACT by a fourth time delay t4, which is determined by the inverters 60–65 and the integrators 66–70, and provides the delayed activation signal ACT, or a second delayed signal S2, to the NOR circuit 51. The number of integrators in the second delay circuit 47 is greater than that of the first signal generation circuit 31. Accordingly, the fourth time delay t4 is longer than the first time delay t1. In other words, the second delayed signal S2 goes high after the first control signal CACT becomes high.

A second input terminal of the NOR circuit 51 is provided with a write signal /WRT via the inverter 48. Thus, the NOR circuit 51 outputs the inverted second delayed signal S2 when the write signal WRT is high and outputs a low signal when the write signal WRT is low.

The output terminal of the NOR circuit 51 is connected to a second input terminal of the NAND circuit 52 via the inverter 49. The NAND circuit 52 is therefore provided with the inverted output signal of the NOR circuit 51, or a third delayed signal S3.

A third input terminal of the NAND circuit 52 is provided with the precharge signal PRE. The NAND circuit 52 performs an NAND operation with the precharge signal PRE, the first delayed signal S1-, and the third delayed signal S3, and provides an NAND logic signal to the inverter 50. When the precharge signal PRE is high, the NAND circuit 52 performs the NAND operation with the first and third delayed signals S1, S3 and outputs a corresponding NAND logic signal. When the precharge signal PRE is low, the NAND circuit 52 outputs a high signal. The level of the third delayed signal S3 corresponds with the write signal WRT, and is either low or equal to the level of the second delayed signal S2.

Accordingly, the NAND circuit 52 outputs the first delayed signal S1 when the precharge signal PRE is high and the write signal WRT is low. The NAND circuit 52 outputs the inverted third delayed signal S3 (second delayed signal S2) when the precharge signal PRE and the write signal WRT are both high. The inverter 50 inverts the inverted signal and generates the third control signal SACT.

Figure 9:
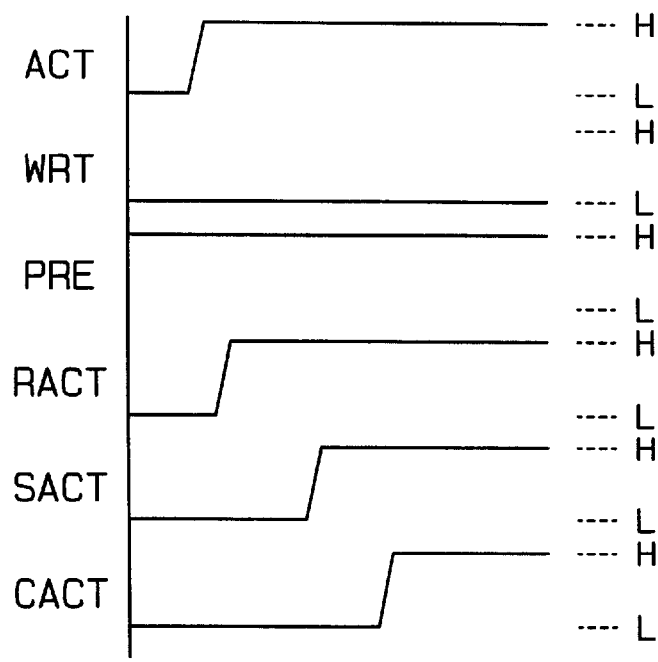
FIG. 9 is a waveform diagram of signals of the control circuit of FIG. 8 during a read mode.

The write signal WRT goes low during the read mode and goes high during the write mode. Thus, the third control signal SACT shifts in the same manner as the first delayed signal S1 during the read mode. Referring to FIG. 9, this causes the second control signal RACT to go high first, the third control signal SACT to go high subsequently, and then the first control signal CACT to go high.

Figure 10:
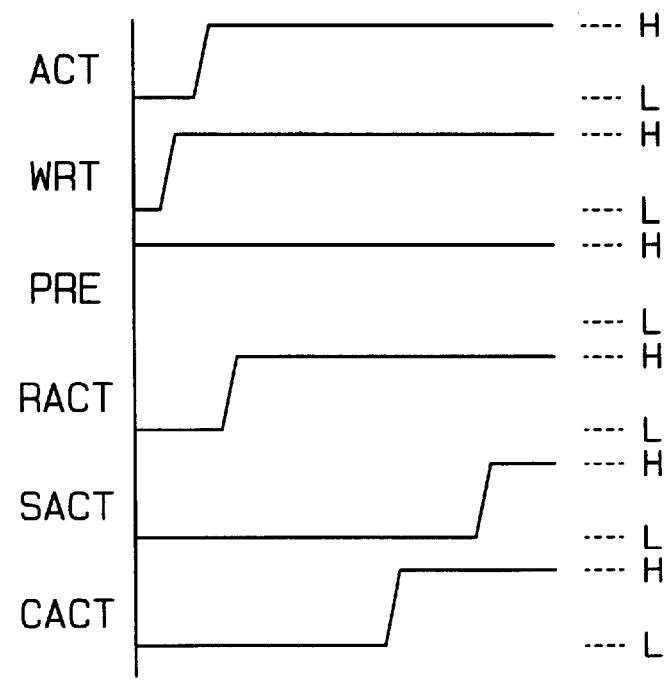
FIG. 10 is a waveform diagram of signals of the control circuit of FIG. 8 during a write mode.

The third control signal SACT shifts in the same manner as the third delayed signal S3 during the write mode. Referring to FIG. 10, this causes the second control signal RACT to go high first, the first control signal CACT to go high subsequently, and then the third control signal SACT to go high.

Referring back to FIG. 7, the control signals RACT, CACT, SACT are provided to the row decoder 23, the column decoder 22, and the sense amplifier 25, respectively. Thus, during the read mode, the sense amplifier 25 is activated before the column decoder 22 generates the column selection signal CL. During the write mode, the sense amplifier 25 is activated after the column decoder 22 generates the column selection signal CL.

Figure 11:
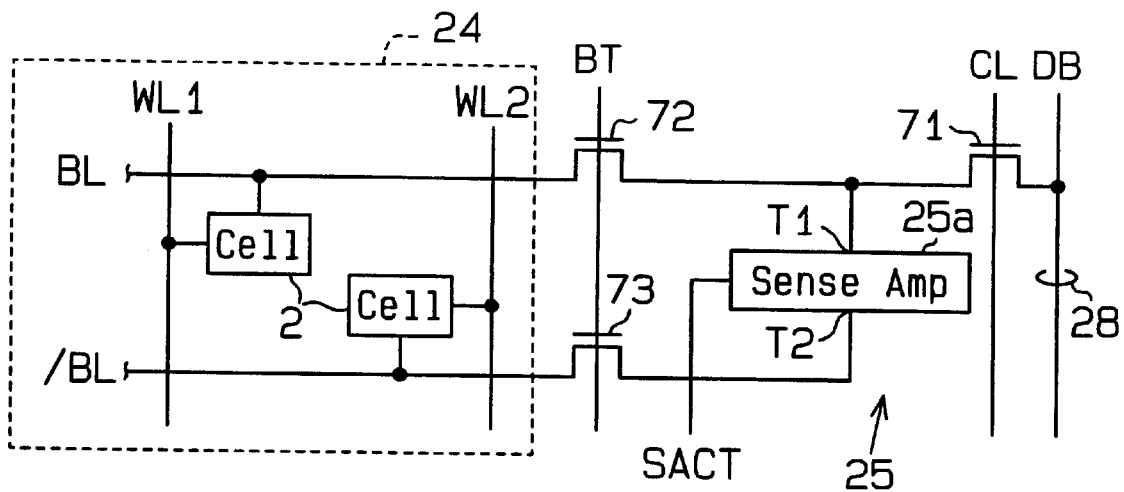
FIG. 11 is a schematic circuit diagram of a cell array and a sense amplifier of the semiconductor memory of FIG. 7.

FIG. 11 is a circuit diagram illustrating the connection of the local data bus, the sense amplifier 25, and the cell array 24 (see FIG. 7).

The cell array 24 includes a plurality of word lines (only word lines WL1, WL2 are illustrated in FIG. 11) and a plurality of bit line pairs (only bit line pair BL, /BL is illustrated in FIG. 11). Two memory cells 2 are connected to the nodes between the word lines WL1, WL2 and the bit line pair BL, /BL. The bit line pairs are connected by way of a holded bit line technique.

The local data bus is provided with a signal data bit line for every bit of data. The sense amplifier 25 includes a sense amplifier 25 associated with the bit line pair BL, /BL, a column gate 71 for each data bus line DB, and two transfer gates 72, 73 associated with the bit line pair BL, /BL. The data bus line DB is connected to one of the two bit lines BL, /BL (e.g., the bit line BL in the first embodiment) via the transfer gate 72 and the column gate 71.

A first I/O terminal T1 of the sense amplifier 25a is connected between the column gate 71 and the transfer gate 72. A second I/O terminal T2 of the sense amplifier 25a is connected to the transfer gate 73. The gate terminal of the column gate 71, which is preferably an n-channel MOS transistor, receives the column selection signal CL. The gate terminal of each of the transfer gates 72, 73, which is preferably an n-channel MOS transistor, receives a control signal BT.

Figure 12:
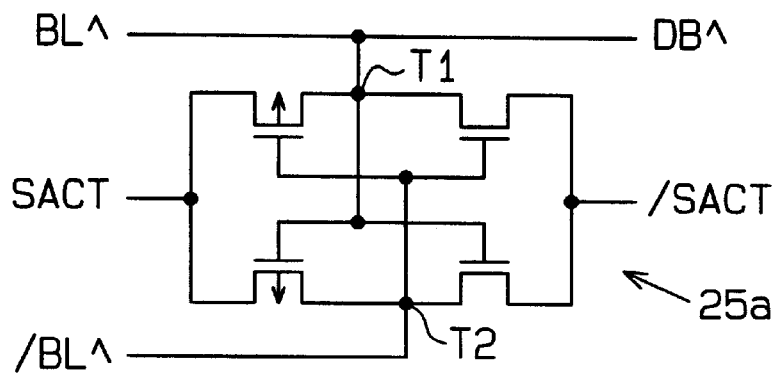
FIG. 12 is a schematic circuit diagram of the sense amplifier of FIG. 11.

The sense amplifier 25a is a latch-type sensor amplifier, such as that shown in FIG. 12, and is activated and deactivated by the third control signal SACT and its inverted signal /SACT (or a sense amplifier drive power generated in accordance with the third control signal SACT). In the first embodiment, the sense amplifier 25a is activated by the high third control signal SACT and its inverted signal /SACT.

Figure 13:
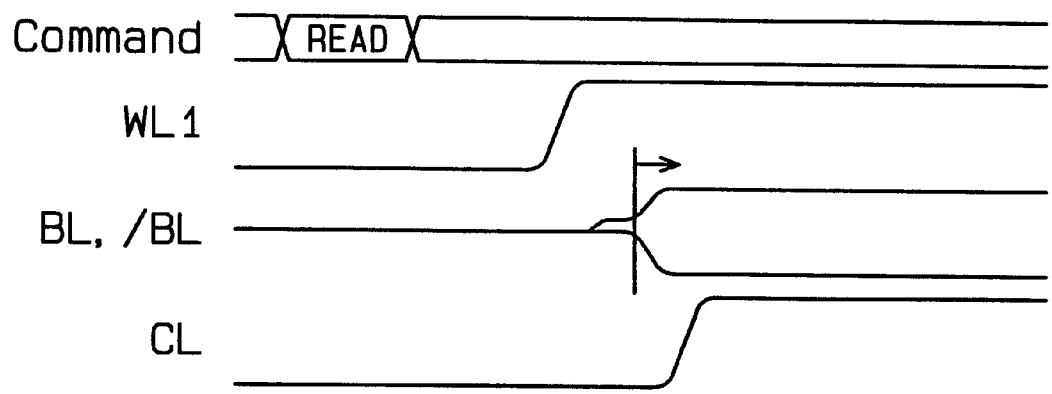
FIG. 13 is a waveform diagram of signals of the semiconductor memory of FIG. 7 during the read mode.

The read operation and the write operation of the FCRAM 11 will now be discussed. FIG. 13 is a diagram showing the waveforms of signals during the read mode.

When the semiconductor memory 11 receives a read command (READ), the word line WL1 is activated in accordance with the read command by the second control signal RACT. This transfers data from the memory cell 2 connected to the word line WL1 to the bit line BL. The data is then transferred to the sense amplifier 25a through the transfer gates 72, 73, which are activated by the control signal BT.

When the third control signal SACT activates the sense amplifier 25a, the read data is amplified. When the first control signal CACT causes the column selection signal CL to go high and activate the column gate 71, the amplified data is transferred to the data bus line DB.

Figure 14:
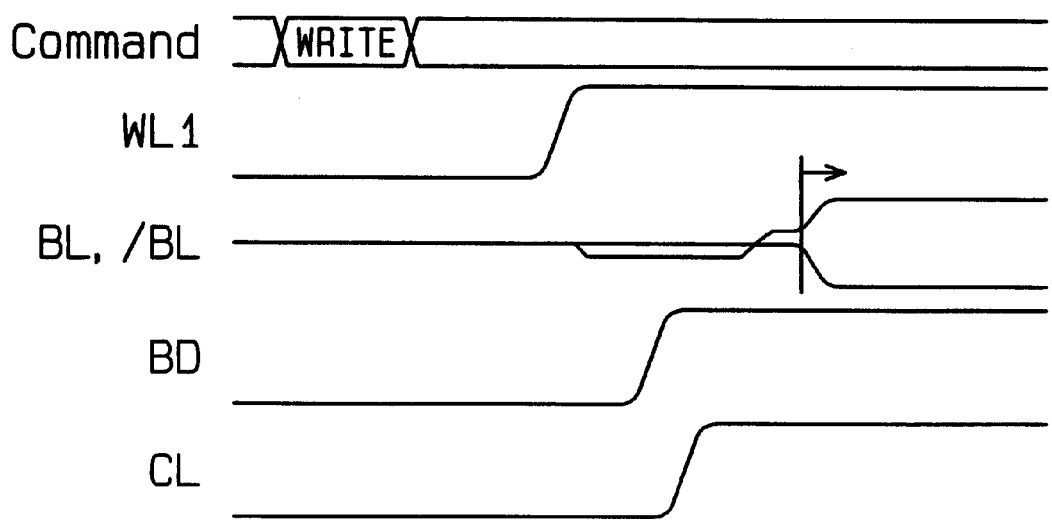
FIG. 14 is a waveform diagram of signals of the semiconductor memory of FIG. 7 during the write mode.

FIG. 14 is a diagram showing the waveforms of signals during the write operation. When the FCRAM 11 receives a write command (WRITE), the write command causes the second control signal RACT to activate the word line WL1. This transfers data from the memory cell 2 connected to the word line WL1 to the bit line BL. The data is then transferred to the sense amplifier 25a through the transfer gates 72, 73, which are activated by the control signal BT.

Then, the potential at the data bus line DB increases in accordance with the transferred write data, and the first control signal CACT causes the column selection signal CL to go high. In this state, the potential at the two I/O terminals T1, T2 is close to the precharge level of the bit line pair BL, /BL, and smaller than the high potential at the data bus line DB. Accordingly, the high column selection signal CL activates the column gate 71 and transfers the write data to the sense amplifier 25a.

The third control signal SACT then activates the sense amplifier 25a and amplifies the write data. This shifts the potential at the bit line pair BL, /BL to a predetermined potential. In this manner, data is stored in the memory cell 2, which is connected to the activated word line WL1, in accordance with the potential at the bit line BL.

Figure 1:
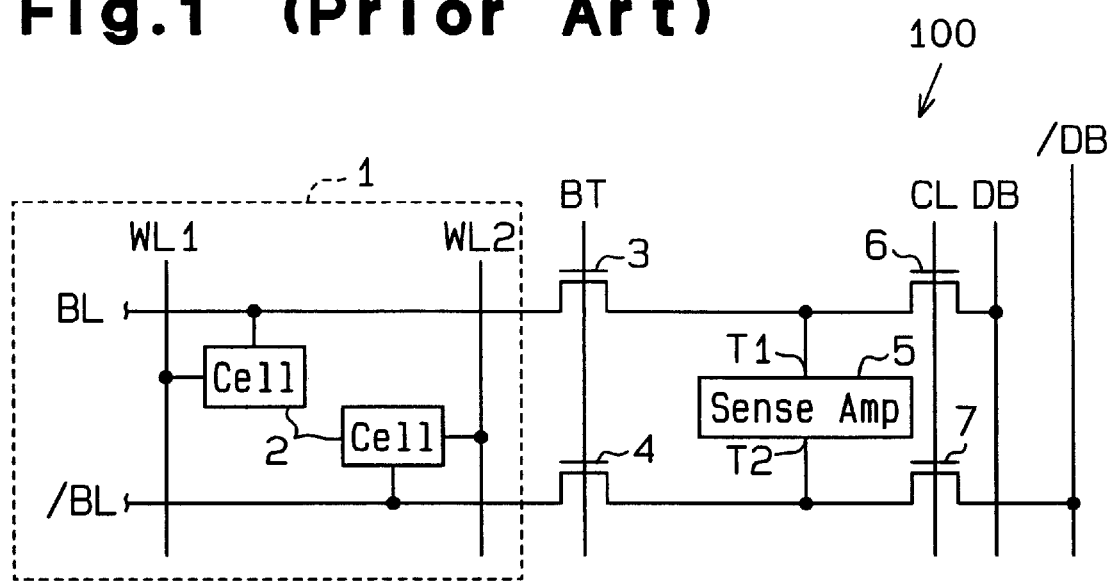
FIG. 1 is a schematic partial circuit diagram of a first prior art example of a semiconductor memory.
Figure 2:
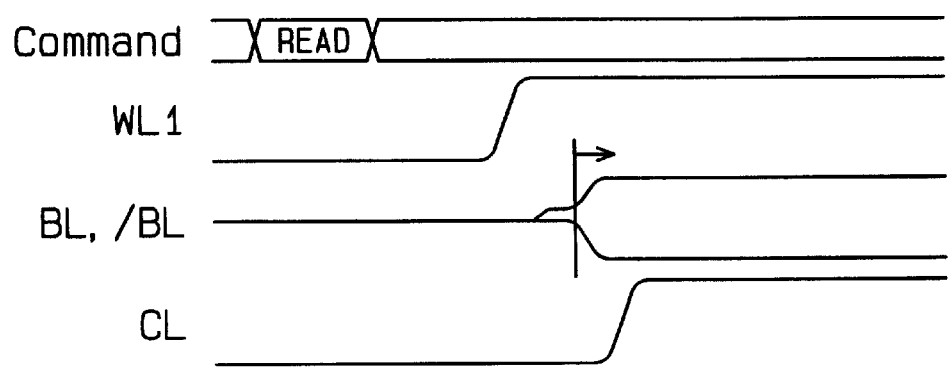
FIG. 2 is a waveform diagram of the semiconductor memory of FIG. 1 during a read mode.
Figure 3:
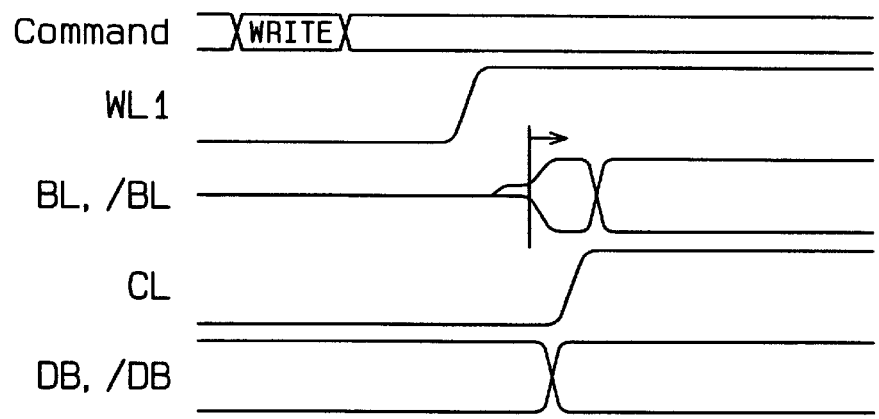
FIG. 3 is a waveform diagram of signals of the semiconductor memory of FIG. 1 during a write mode.
Figure 4:
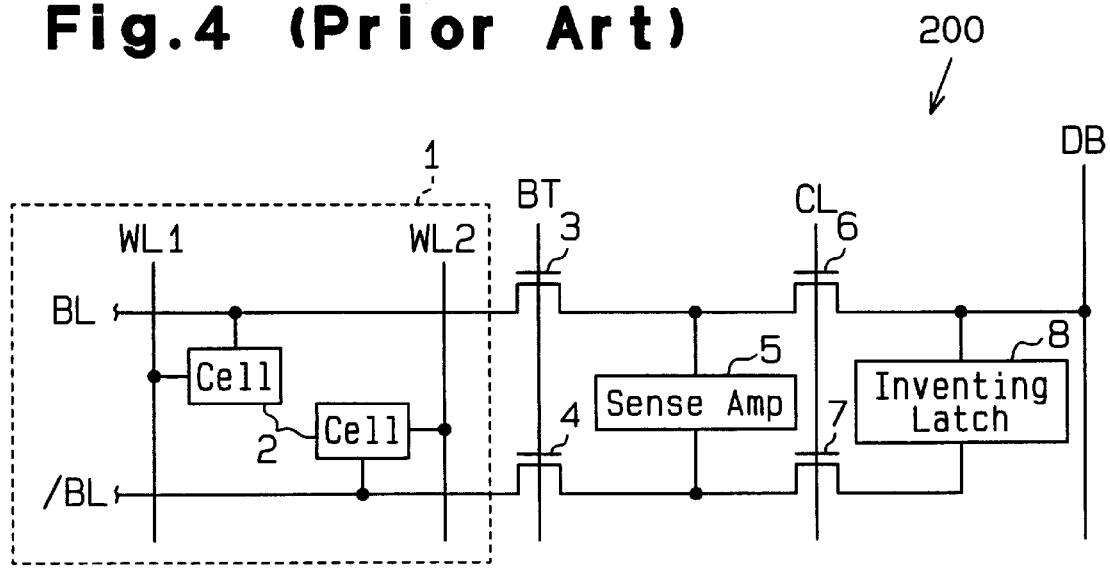
FIG. 4 is a schematic partial circuit diagram of a second prior art example of a semiconductor memory.
Figure 5:
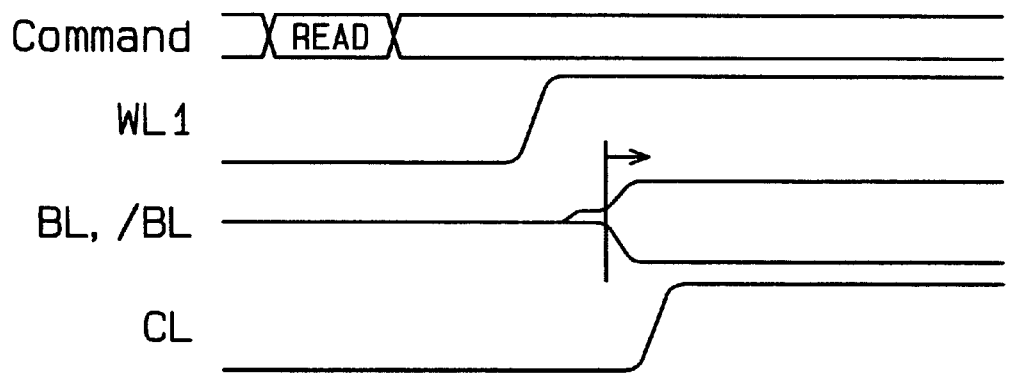
FIG. 5 is a waveform diagram of signals of the semiconductor memory of FIG. 4 during a read mode.
Figure 6:
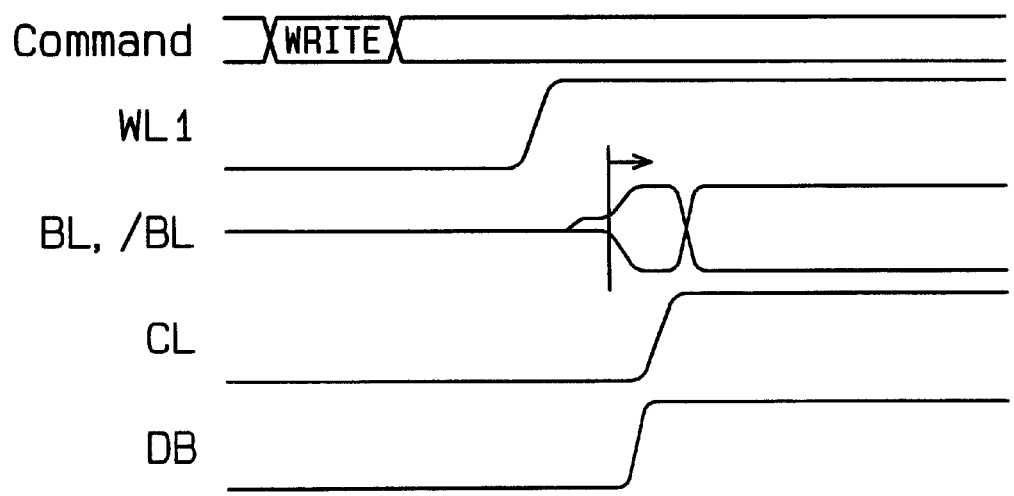
FIG. 6 is a waveform diagram of signals of the semiconductor memory of FIG. 4 during a write mode.

By delaying the activation of the sense amplifier 25a relative to the control of the column gate 71, the transfer of the write data from the data bus DB to the sense amplifier 25a is guaranteed without employing the inverting latch 8 of the second prior art example illustrated in FIG. 4.

The advantage of the semiconductor memory 11 of the first embodiment is as follows.

(1) During the write mode, the control circuit 27 first activates the column gate 71. After applying the write data to the first I/O terminal of the sense amplifier 25a, the control circuit 27 activates the sense amplifier 25a. The activated sense amplifier 25a amplifies the potential at the bit line BL, which is connected to the first I/O terminal T1, to the potential of the data. Further, the activated sense amplifier 25a amplifies the inverted potential at the inverting bit line /BL to the potential of the data. Thus, only one data bus line is required to transfer a bit of data. This decreases the area occupied by the local data bus 28 and decreases the circuit scale of the FCRAM 11.

[Second Embodiment]

Figure 15:
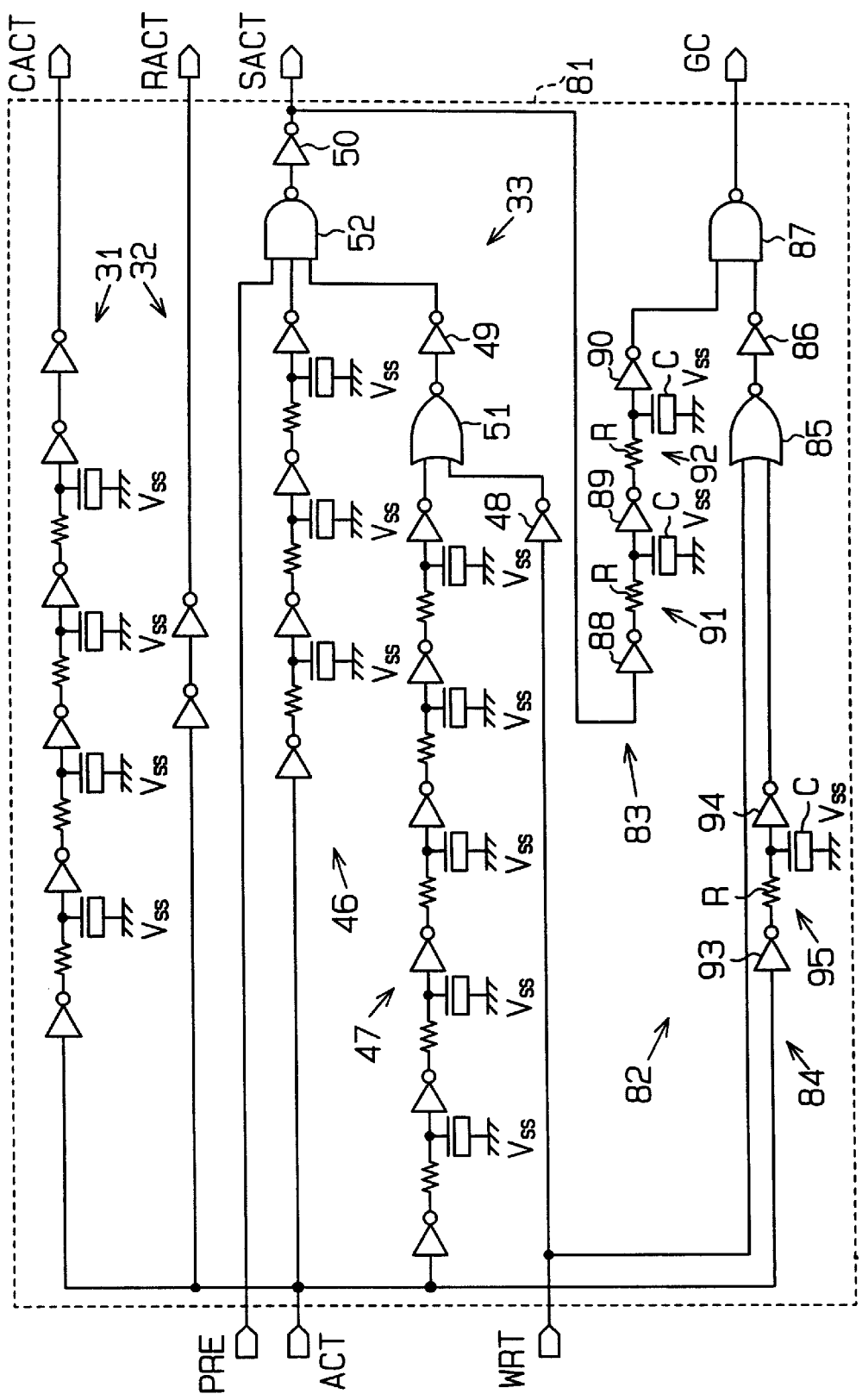
FIG. 15 is a schematic block circuit diagram of a control circuit of the semiconductor device according to a second embodiment of the present invention.

FIG. 15 is a schematic block circuit diagram of a control circuit 81 employed in a semiconductor device according to a second embodiment of the present invention.

The control circuit 81 is employed in lieu of the control circuit 27 of the semiconductor memory 11 of FIG. 7. In other words, each of the banks B1–Bn of the semiconductor memory 11 has the control circuit 81.

The control circuit 81 receives, as an internal command, the precharge signal PRE, the activation signal ACT, and the write signal WRT from the command decoder circuit 13. Then, the control circuit 81 generates control signals CACT, RACT, ACT, GC based on the internal command.

The control circuit 81 includes signal generation circuits 31, 32, 33, 82, which respectively generate the control signals CACT, RACT, SACT, GC. The first to third signal generation circuits 31–33 are identical to those of the first embodiment.

The fourth signal generation circuit 82 is a gate control signal generation circuit and generates a fourth control signal GC to control a transfer gate in accordance with the activation signal ACT, the write signal WRT, and the third control signal SACT.

The fourth signal generation circuit 82 includes a first delay circuit 83, a second delay circuit 84, an NOR circuit 85, an inverter 86, and an NAND circuit 87.

The first delay circuit 83 includes an odd number (three in the second embodiment) of inverters 88, 89, 90 and a plurality (two in the second embodiment) of integrators 91, 92. Each of the integrators 91, 92 includes a resistor R and a capacitor C. The inverters 88–90 are connected in series. Each of the integrators 91, 92 is connected between an adjacent pair of the inverters 88–90. The first inverter 88 is provided with the third control signal SACT, and the output terminal of the third inverter 90 is connected to a first input terminal of the NAND circuit 87. The first delay circuit 83 inverts the third control signal SACT and delays the inverted third control signal SACT by a fifth time delay t5, which is determined by the inverters 88–90 and the integrators 91, 92, and provides the delayed, inverted third control signal SACT, or a fourth delayed signal S4, to a first input terminal of the NAND circuit 87.

The second delay circuit 84 includes an even number (two in the second embodiment) of inverters 93, 94 and an integrator 95, which is connected between the inverters 93, 94. The integrator 95 includes a resistor R and a capacitor C. The first inverter 93 is provided with the activation signal ACT, and the output terminal of the second inverter 94 is connected to a first input terminal of the NOR circuit 85. The second delay circuit 84 delays the activation signal ACT by a sixth time delay t6, which is determined by the inverters 93, 94 and the integrator 95, and provides the delayed activation signal ACT, or a fifth delayed signal S5, to the first input terminal of the NOR circuit 85. The number of integrators in the second delay circuit 84 is less than that of the first delay circuit 46 in the third signal generation circuit 33. Accordingly, the second delay circuit 84 shifts the fifth delayed signal S5 after the second control signal RACT and before the first delayed signal S1.

A second input terminal of the NOR circuit 85 is provided with a write signal WRT. Thus, the NOR circuit 85 outputs the inverted fifth delayed signal S5 when the write signal WRT is low and causes the fifth delayed signal S5 to go low when the write signal WRT is high.

The output signal of the NOR circuit 85 is provided to the second input terminal of the NAND circuit 87 via the inverter 86. Thus, the NAND circuit 87 receives the inverted output signal of the NOR circuit 85, or a sixth delayed signal S6. The NAND circuit 87 performs an NAND operation with the fourth and sixth delayed signals S4, S6 to generate the fourth control signal GC.

Figure 16:
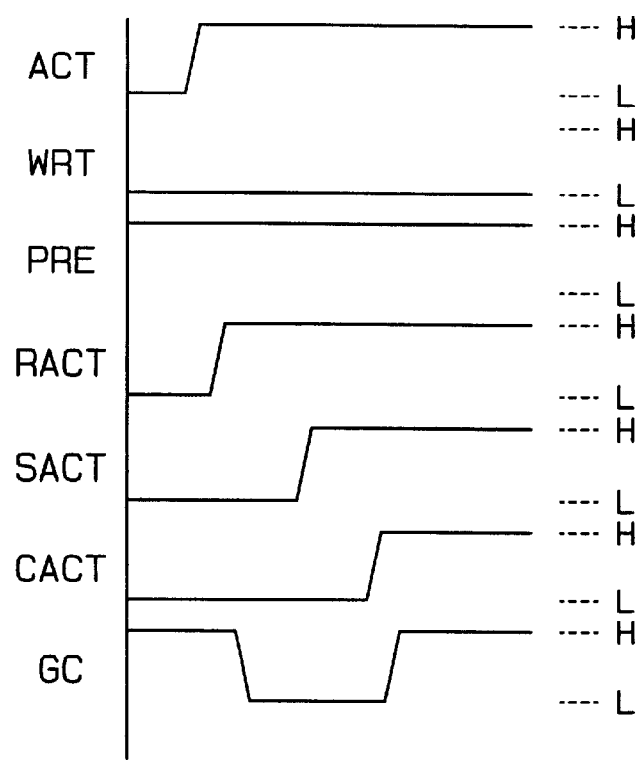
FIG. 16 is a waveform diagram of the control circuit of FIG. 15 during a read mode.

With reference to FIG. 16, when the write signal WRT is low (i.e., during the read mode), the fourth signal generation circuit 82 causes the trailing edge of the control signal GC to be delayed from the leading edge of the activation signal ACT by the time delay t6. Further, the fourth signal generation circuit 82 causes the leading edge of the control signal GC to be delayed from the leading edge of the third control signal SACT by the time delay t5. In other words, after the row decoder 23 (see FIG. 7) is activated, the fourth signal generation circuit 82 maintains the control signal GC at a low level while the sense amplifier 25a (see FIG. 11) and the column decoder 22 (see FIG. 7) are being activated.

Figure 17:
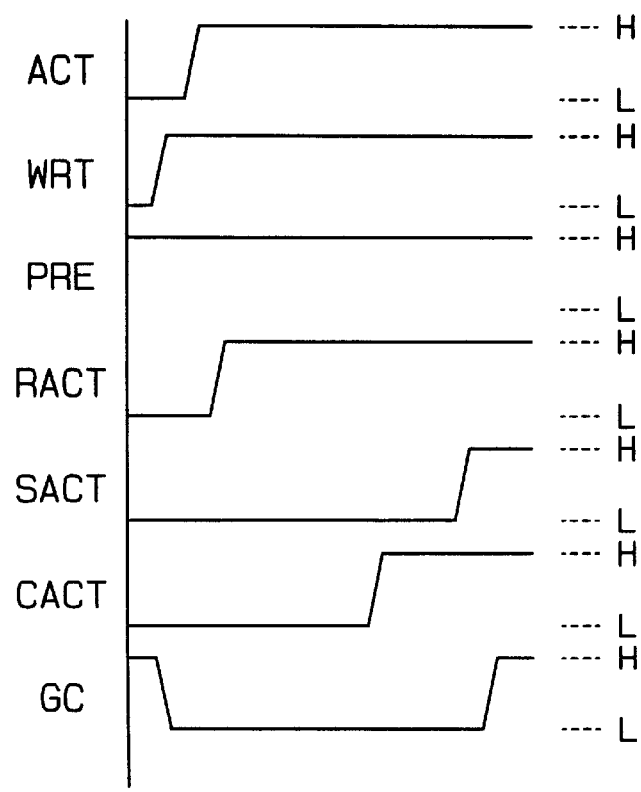
FIG. 17 is a waveform diagram of the control circuit of FIG. 15 during a write mode.

With reference to FIG. 17, when the write signal WRT is high (i.e., during the write mode), the fourth signal generation circuit 82 causes the leading edge of the control signal GC to be delayed from the leading edge of the third control signal SACT by the time delay t5. In other words, after the write signal WRT goes high, the fourth signal generation circuit 82 maintains the control signal GC at a low level until the sense amplifier 25a is activated.

Figure 18:
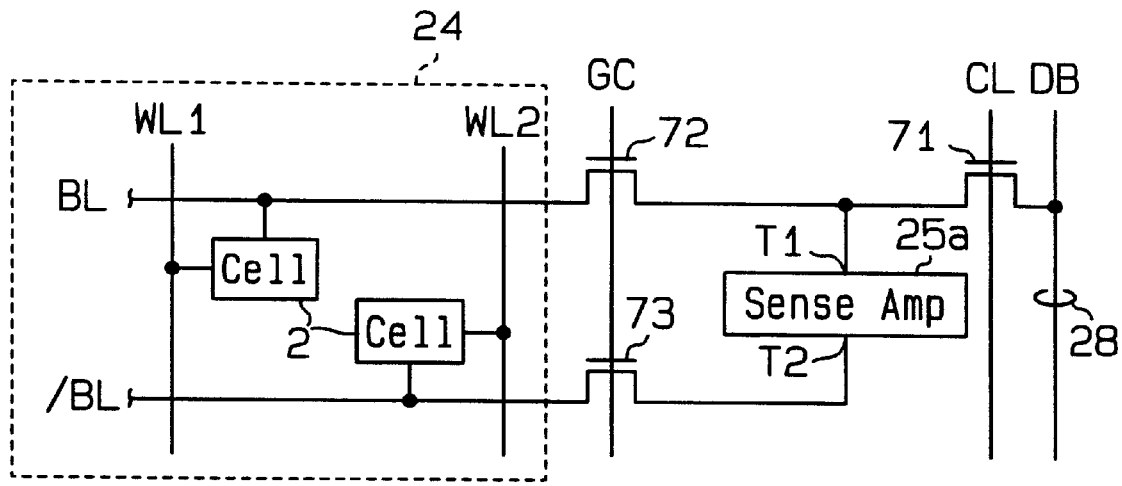
FIG. 18 is a schematic circuit diagram of a cell array and a sense amplifier of the semiconductor memory of FIG. 15.

With reference to FIG. 18, the control signal GC is provided to the gate terminals of the transfer gates 72, 73. The transfer gates 72, 73, each of which is preferably an n-channel MOS transistor, is deactivated when the control signal GC goes low and activated when the control signal GC goes high.

Figure 19:
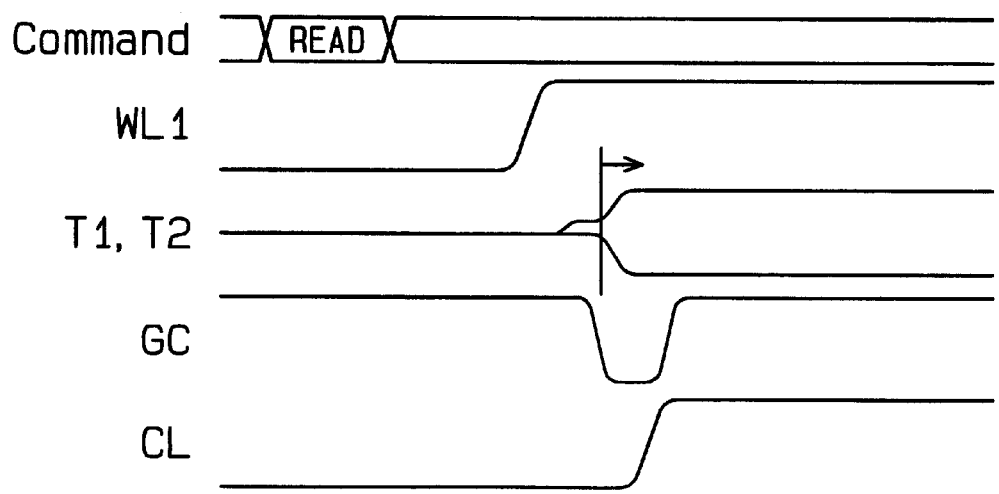
FIG. 19 is a waveform diagram of signals of the semiconductor memory of FIG. 15 during the read mode.

With reference to FIG. 19, after data is transferred from the memory cells 2 to the bit line pair BL, /BL during the read mode, the fourth signal generation circuit 82 deactivates the transfer gates 72, 73 before activating the sense amplifier 25a. Subsequently, the fourth signal generation circuit 82 activates the transfer gates 72, 73 after the column selection signal CL goes high and data is transferred to the data bus line DB.

When the sense amplifier 25a (see FIG. 11) is activated, the fourth signal generation circuit 82 disconnects the bit line pair BL, /BL from the sense amplifier 25a to decrease the load applied to the sense amplifier 25a. This changes the potential at the output terminal of the sense amplifier 25a more quickly than the first embodiment and increases the speed for reading data.

Figure 20:
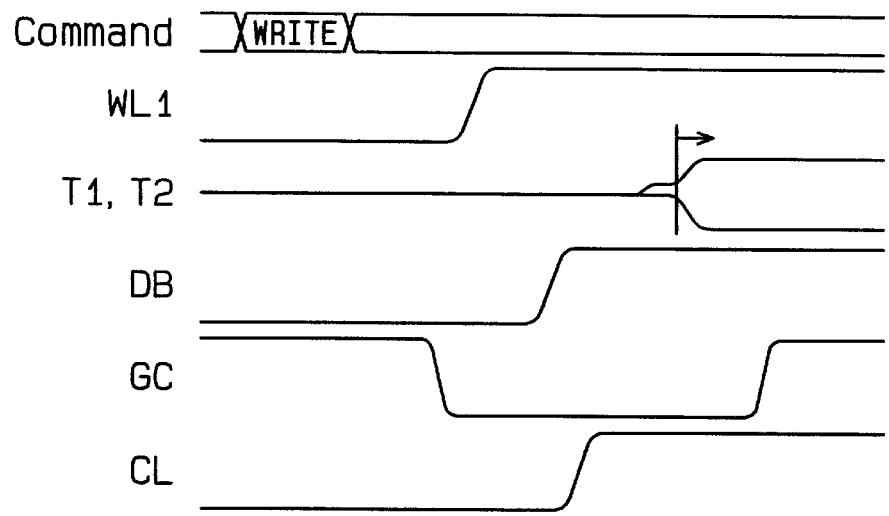
FIG. 20 is a waveform diagram of signals of the semiconductor memory of FIG. 15 during the write mode.

With reference to FIG. 20, during the write mode, the fourth signal generation circuit 82 deactivates the transfer gates 72, 73 before the word line WL1 is activated. This disconnects the bit line pair BL, /BL from the sense amplifier 25a and prevents the activation of the word line WL1 from transmitting the data read from the memory cells 2 to the sense amplifier 25a. Thus, the sense amplifier 25a is only required to change the potential at the I/O terminals T1, T2 from the precharge potential. In this state, the load applied to the bit line pair BL, /BL is further decreased, and the potential at the I/O terminals T1, T2 changes more quickly than in the first embodiment. As a result, the speed for transmitting data from the data bus DB to the sense amplifier 25a increases and enables data writing at a higher speed.

The semiconductor memory-11 of the second embodiment has the advantage described as follows.

(1) The control circuit 81 of the FCRAM 11 deactivates the transfer gates 72, 73 when the sense amplifier 25a is activated and disconnects the bit line pair BL, /BL from the sense amplifier 25a. This decreases the load applied to the sense amplifier 25a, shortens the data amplification time, and enables the reading and writing of data at a higher speed.

It should be apparent to those skilled in the art that the present invention may be embodied in many alternative forms without departing from the principle and the scope of the invention. Particularly, it should be understood that the present invention may be embodied in the following forms.

A semiconductor memory may employ a control circuit that controls the column decoder 22, the row decoder 23, and the sense amplifier 25 of each of the banks B1–Bn (as shown in FIG. 7).

Figure 21:
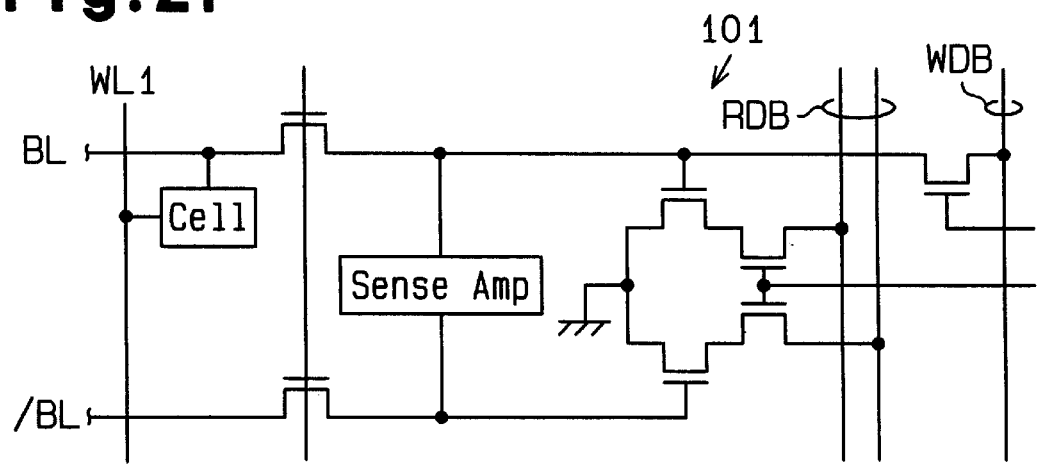
FIG. 21 is a circuit diagram of a cell array and a sense amplifier employed in an exemplary embodiment according to the present invention.

The control circuits 27, 81 (shown in FIGS. 7 and 11) may be applied to other types of semiconductor memories, such as a direct sense semiconductor memory 101 shown in FIG. 21. This decreases the number of data bus lines WDB and the circuit area of the semiconductor memory 101.

Figure 22:
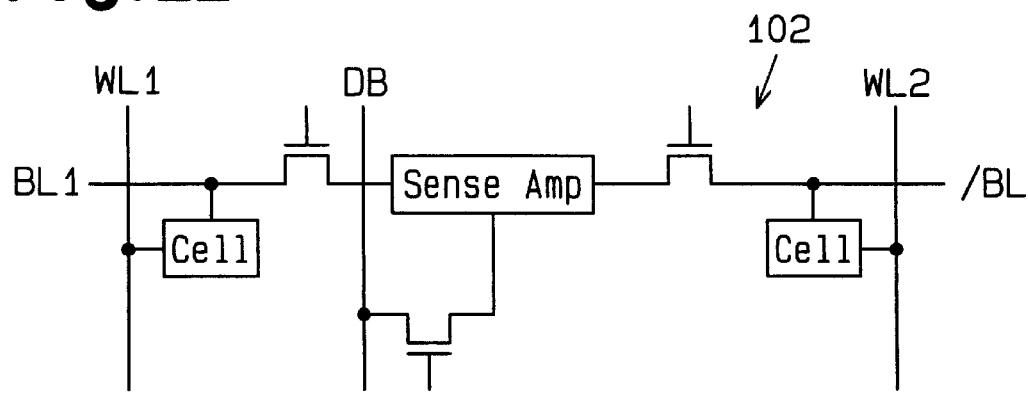
FIG. 22 is a circuit diagram of a cell array and a sense amplifier employed in an alternative embodiment according to the present invention.

The present invention may be employed in an open bit line type semiconductor device 102, such as that shown in FIG. 22.

The sense amplifier employed in the present invention can be, for example, a CMOS differential amplification sense amplifier using a reference voltage, or a current mirror sense amplifier.

The present invention may be applied to other DRAMs, such as an SLDRAM, an MDRAM, an RDRAM, an SDRAM, and an FPDRAM.

The above examples and embodiments are to be considered as illustrative and not restrictive, and the invention is not to be limited to the details given herein, but may be modified within the scope and equivalence of the appended claims.

What is claimed is:

1. A semiconductor memory including a plurality of memory cells and having a write mode, the semiconductor memory comprising:

a plurality of pairs of bit lines connected to the memory cells;

a plurality of sense amplifiers, each having a first I/O terminal and a second I/O terminal which are connected to an associated pair of the bit lines;

a plurality of column selection gates, each connected to the first I/O terminal of an associated one of the sense amplifiers;

a data bus connected to the column selection gates; and a control circuit connected to the sense amplifiers, wherein the control circuit controls the sense amplifiers and the column selection gate, such that selected column selection gate turns on before the sense amplifiers are activated during the write mode.

2. The semiconductor memory according to claim 1, wherein the control circuit detects whether the semiconductor memory is in the write mode or the read mode, upon receiving a semiconductor memory activation command.

3. The semiconductor memory according to claim 2, wherein the control circuit activates a corresponding one of the sense amplifiers to amplify a potential at a selected pair of the bit lines before the column selection circuits function upon detecting the read mode.

4. The semiconductor memory according to claim 2, further comprising:

a plurality of word lines connected to the memory cells;

a row decoder connected to the word lines to selectively activate the word lines; and a column decoder connected to the column selection circuits to generate a signal for controlling the column selection circuits, wherein the control circuit generates, in accordance with the activation command, a first control signal for controlling activation and deactivation of the row decoder, a second control signal for controlling the column decoder, and a third control signal for controlling the sense amplifiers.

5. The semiconductor memory according to claim 4, further comprising:

a plurality of pairs of transfer gates, wherein each pair of the transfer gates is connected between an associated pair of the bit lines and the first and second I/O terminals of an associated one of the sense amplifiers, and wherein the control circuit generates, in accordance with the activation command, a fourth control signal for controlling the transfer gates.

6. The semiconductor memory according to claim 1, further comprising:

a plurality of pairs of transfer gates, wherein each pair of the transfer gates is connected between an associated pair of the bit lines and the first and second I/O terminals of an associated one of the sense amplifiers, wherein the control circuit deactivates the transfer gates when the sense amplifiers are activated.

7. The semiconductor memory according to claim 6, wherein the control circuit controls the transfer gates so that the transfer gates are deactivated after the data read from a selected one of the memory cells is transferred to an associated one of the sense amplifiers via a corresponding pair of the bit lines during the read mode, and the transfer gates are deactivated before data is transferred from a pair of the bit lines corresponding to a selected one of the sense amplifiers during the write mode.

8. The semiconductor memory according to claim 6, further comprising:

a plurality of word lines connected to the memory cells;

a row decoder connected to the word lines to selectively activate the word lines; and a column decoder connected to the column selection circuits to generate a signal for controlling the column selection circuits, wherein the control circuit detects whether the semiconductor memory is in the write mode or the read mode upon receiving a semiconductor memory activation command, and wherein the control circuit generates, in accordance with the activation command, a first control signal for controlling activation and deactivation of the row decoder, a second control signal for controlling the column decoder, and a third control signal for controlling the sense amplifiers.

9. The semiconductor memory according to claim 8, wherein the control circuit generates, in accordance with the activation command, a fourth control signal for controlling the transfer gates.

10. A method for controlling a semiconductor memory including a plurality of memory cells, a plurality of pairs of bit lines connected to the memory cells, a plurality of sense amplifiers, each connected to an associated pair of the bit lines and having a first I/O terminal and a second I/O terminal, a plurality of column selection gates, each connected to the first I/O terminal of an associated one of the sense amplifiers, and a data bus connected to the column selection gates, wherein the semiconductor memory operates in a write mode and a read mode, such that data is written to the memory cells in the write mode, data is read from the memory cells in the read mode, the method comprising:

selectively operating the column selection circuits to apply a potential of the data bus to the first I/O terminal of a selected one of the sense amplifiers during the write mode; and activating the selected one of the sense amplifiers during the write mode after the potential applying step is performed.

11. The method according to claim 10, further comprising:

activating the selected one of the sense amplifiers before selectively operating the column selection circuits, when the semiconductor memory shifts from the write mode to the read mode; and amplifying a potential at a pair of the bit lines associated with data read from a selected one of the memory cells with the selected one of the sense amplifiers, when the semiconductor memory shifts from the write mode to the read mode.

12. The method according to claim 10, wherein the semiconductor memory further includes a plurality of pairs of transfer gates, wherein each pair of the transfer gates is connected between an associated pair of the bit lines and the first and second I/O terminals of an associated one of the sense amplifiers, the method further comprising:

deactivating the transfer gates when the sense amplifiers are activated.

13. The method according to claim 12, the method further comprising:

transferring data read from a selected one of the memory cells to an associated one of the sense amplifiers via a corresponding pair of the bit lines during the read mode;

deactivating the transfer gates during the read mode after transferring data read from the selected one of the memory cells;

activating the associated one of the sense amplifiers during the read mode after deactivating the transfer gates;

deactivating the transfer gates before data is transferred from a pair of the bit lines corresponding to a selected one of the sense amplifiers during the write mode; and activating the associated one of the sense amplifiers during the write mode after deactivating the transfer gates.

14. A method for writing a semiconductor memory, the method comprising:

selectively operating column selection circuits to apply a potential of the data bus to a first I/O terminal of a selected one of sense amplifiers; and activating the selected one of the sense amplifiers after the potential applying step is performed.

* * * * *